(12) United States Patent
Ishii et al.

(10) Patent No.: US 7,296,533 B2
(45) Date of Patent: Nov. 20, 2007

(54) RADIAL ANTENNA AND PLASMA DEVICE USING IT

(75) Inventors: Nobuo Ishii, Hyogo (JP); Kibatsu Shinohara, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 230 days.

(21) Appl. No.: 10/343,221

(22) PCT Filed: Aug. 3, 2001

(86) PCT No.: PCT/JP01/06698

§ 371 (c)(1),
(2), (4) Date: Jun. 18, 2003

(87) PCT Pub. No.: WO02/13250

PCT Pub. Date: Feb. 14, 2002

(65) Prior Publication Data
US 2004/0045674 A1    Mar. 11, 2004

(30) Foreign Application Priority Data
Aug. 4, 2000    (JP) .............................. 2000-236716

(51) Int. Cl.
*C23C 16/00*    (2006.01)
(52) U.S. Cl. ..................... 118/723 MW; 118/723 MA; 156/345.36; 156/345.41; 156/345.42
(58) Field of Classification Search ....... 118/723 MW, 118/723 MA, 723 ME, 723 MR, 723 AN; 156/345.36, 345.41, 345.42

See application file for complete search history.

(56) References Cited

U.S. PATENT DOCUMENTS 5,698,036 A    12/1997    Ishii et al.

FOREIGN PATENT DOCUMENTS

| JP | 11-67492    | * | 3/1999 |
| JP | 11-067492 A |   | 3/1999 |
| JP | 2000-164394 A |  | 6/2000 |
| JP | 2000-164394 A |  | 6/2000 |

* cited by examiner

*Primary Examiner*—Parviz Hassanzadeh
*Assistant Examiner*—Michelle Crowell
(74) *Attorney, Agent, or Firm*—Crowell & Moring LLP

(57) ABSTRACT

A plasma device includes a first conductive plate (31) in which a plurality of slots (36) are formed, a second conductive plate (32) having a microwave inlet (35) and disposed opposite to the first conductive plate (31), a ring member (34) for connecting peripheral edges of the first and second conductive plates (31, 32), and a conductive adjusting member (37) provided on said second conductive plate (32) within a radial waveguide (33) formed by the first and second conductive plates (31, 32) and serving to adjust a distance (d1, d2) up to the first conductive plate (31). With this arrangement, a desired electric field radiation distribution can be obtained without inducing abnormal discharge.

8 Claims, 6 Drawing Sheets

RADIAL ANTENNA AND PLASMA DEVICE USING IT

BACKGROUND OF THE INVENTION

The present invention relates to a radial antenna and a plasma device using it.

In the manufacture of a semiconductor device, plasma devices are used often to perform processes such as formation of an oxide film, crystal growth of a semiconductor layer, etching, and ashing. Among the plasma devices, a microwave plasma device is available which produces a high-density plasma by introducing a microwave into a processing vessel through a radial antenna. As a characteristic feature of the microwave plasma device, it has wide applications because it can stably produce a plasma even if the pressure is comparatively low.

FIG. 7 includes views showing the arrangement of an example of a radial antenna conventionally used in the microwave plasma device, and the distribution of its electric field radiation. FIG. 7(a) is a conceptual view showing the radiation surface of the radial antenna, FIG. 7(b) is a sectional view taken along the line VIIb-VIIb' of FIG. 7(a), and FIG. 7(c) is a conceptual view showing the distribution of the electric field radiated by the radial antenna. In FIG. 7(c), the axis of abscissa represents the distance from the center of the radial antenna in the radial direction, and the axis of ordinate represents the strength of the electric field radiated from the radial antenna. FIG. 8 is a view showing the shape of a slot formed in the radiation surface of the radial antenna shown in FIG. 7.

As shown in FIG. 7(b), a radial antenna 230 conventionally used in the plasma device is formed of two parallel conductive plates 231 and 232 which form a radial waveguide 233, and a ring member 234 which connects the peripheral edges of the conductive plates 231 and 232. A microwave inlet 235 is formed at the center of the conductive plate 232 to introduce a microwave from a microwave generator (not shown). The conductive plate 231 also has a large number of slots 236 to radiate the microwave propagating in the radial waveguide 233 to a processing vessel (not shown). When the influence on the electromagnetic field in the radial waveguide 233 is considered, the smaller a width W2 of each slot 236, the better. If, however, the width W2 is excessively small, it may cause abnormal discharge. Thus, the width W2 is usually set to about 2 mm (W2≦λg/4 where λg is the wavelength of the microwave in the radial waveguide 233).

The microwave introduced from the microwave inlet 235 propagates radially from the center toward the peripheral portion of the radial waveguide 233. As the microwave is radiated little by little from the large number of slots 236, the power density in the radial waveguide 233 gradually decreases toward the peripheral portion of the radial waveguide 233. The electric field radiation efficiency of the slots 236 gradually increases as their length or slot length L2 increases from 0 (zero), and reaches the maximum when the slot length L2 corresponds to λg/2.

Under these conditions, in order to obtain the radiated electric field distribution as shown in, e.g., FIG. 7(c), conventionally, the slot length L2 was adjusted, so the radiated electric field strength was controlled. More specifically, the further away from the center of the conductive plate 231, the larger the slot length L2, as shown in FIG. 7(a), so the slot length L2 at the peripheral portion where the power density was small was set close to a length corresponding to λg/2, thus realizing the radiated electric field distribution as shown in FIG. 7(c).

When, hover, W2=λg/2 where the electric field radiation efficiency of the slot 236 becomes maximum, the microwave resonates. Particularly, when the width W2 of the slot 236 is as small as 2 mm, abnormal discharge is induced. When this discharge heats the portion around the slot 236, the surrounding portion of the slot 236 is distorted, or starts to melt.

SUMMARY OF THE INVENTION

The present invention has been made to solve the above problems, and has as its object to obtain a desired electric field radiation distribution without inducing abnormal discharge.

In order to achieve the above object, a radial antenna according to the present invention is characterized by comprising a first conductive plate in which a plurality of slots are formed, a second conductive plate having a microwave inlet and disposed opposite to the first conductive plate, a ring member for connecting peripheral edges of the first and second conductive plates, and a conductive adjusting member provided on the second conductive plate in a radial waveguide formed by the first and second conductive plates and serving to adjust a distance up to the first conductive plate. When the distance from the second conductive plate to the first conductive plate is decreased, the power density between the first and second conductive plates can be increased. Thus, even when the slot length of slots formed in the first conductive plate is decreased to be sufficiently smaller than a length corresponding to λg/2, the radiated electric field strength can be increased.

A plurality of conductive adjusting members may be disposed radially when viewed from the top. Alternatively, one or a plurality of adjusting members may be disposed along the periphery of the second conductive plate.

The conductive member may be set to become higher as it is further away from the center of the second conductive plate. Then, the power density in the radial waveguide in the radial direction can be changed.

In the radial antenna descried above, when the slots are substantially rectangular or arcuate, the slot length is preferably decreased to be smaller than a length corresponding to λg/3. Then, even if the widths of the slots are narrow, induction of abnormal discharge can be prevented effectively.

A plasma device according to the present invention is characterized by comprising a susceptor for placing a target object thereon, a processing vessel for accommodating the susceptor, exhaust means for evacuating an interior of the processing vessel, gas supply means for supplying a gas into the processing vessel, and antenna means which is arranged to oppose that surface of the susceptor where the target object is to be placed and which supplies a microwave into the processing Vessel, wherein the radial antenna described above is used as the antenna means.

DETAILED DESCRIPTION OF THE EMBODIMENTS

The embodiments of the present invention will be described in detail with reference to the drawings. A description will be made by way of examples in which a plasma device using a radial antenna according to the present invention is applied to etching apparatuses.

First Embodiment

Figure 1:
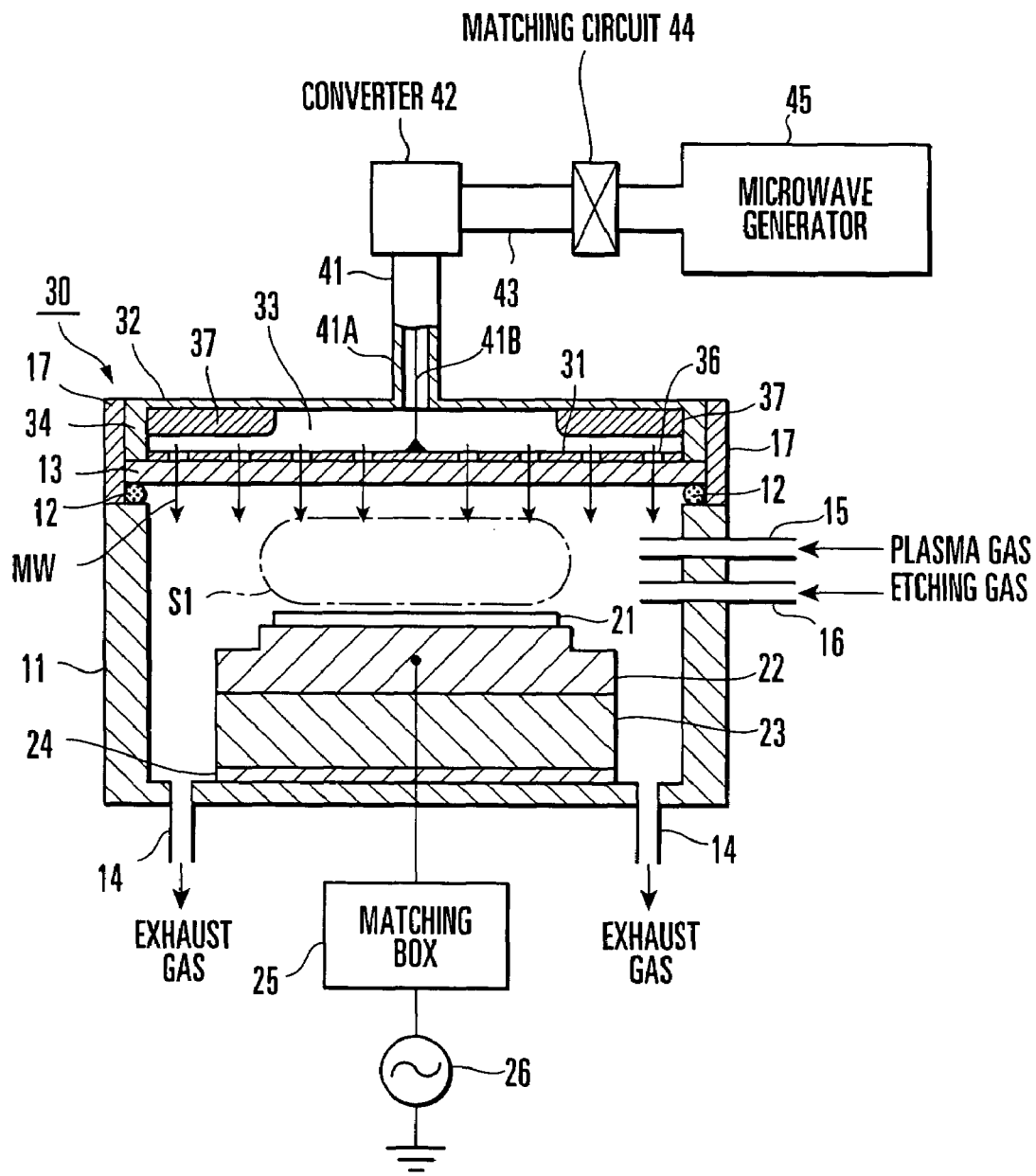
FIG. 1 is a view showing the arrangement of an etching apparatus according to the first embodiment of the present invention.

FIG. 1 is a view showing the arrangement of an etching apparatus according to the first embodiment of the present invention. In FIG. 1, the sectional structure of part of the arrangement is shown.

The etching apparatus shown in FIG. 1 has a cylindrical processing vessel 11 with an upper opening. This processing vessel 11 is made of a conductive member such as aluminum.

Exhaust ports (exhaust means) 14 communicating with a vacuum pump (not shown) are formed in the bottom of the processing vessel 11, so the interior of the processing vessel 11 can be evacuated to a predetermined vacuum degree.

A plasma gas supply nozzle 15 for introducing a plasma gas such as Ar into the processing vessel 11, and a process gas supply nozzle 16 for introducing an etching gas are formed in the upper and lower portions, respectively, of the side wall of the processing vessel 11. The nozzles (gas supply means) 15 and 16 are formed of quartz pipes or the like.

The processing vessel 11 accommodates a susceptor 22 for placing an etching target substrate (target object) 21 on its upper surface. The susceptor 22 is fixed on a support table 23 which is fixed to the bottom of the processing vessel 11 through an insulating plate 24. The susceptor 22 is also connected to a bias RF power supply 26 through a matching box 25.

A flat plate-like dielectric plate 13 is horizontally arranged in the upper opening of the processing vessel 11. Silica glass or a ceramic material (e.g., $Al_2O_3$ or AlN) with a thickness of about 20 mm to 30 mm is used to form the dielectric plate 13. A seal member 12 such as an O-ring is disposed at the bonding portion between the processing vessel 11 and dielectric plate 13. This assures the hermeticity in the processing vessel 11.

A radial antenna 30 is disposed on the dielectric plate 13 with its radiation surface (conductive plate 31 to be described later) facing down. The radial antenna 30 is an antenna means that supplies a microwave MW into the processing vessel 11 through the dielectric plate 13. The dielectric plate 13 is opposed to the radiation surface of the radial antenna 30, and covers the radiation surface entirely.

Hence, the radial antenna 30 is protected from a plasma generated in the processing vessel 11. The circumferential surfaces of the dielectric plate 13 and radial antenna 30 are covered by a shield material 17.

Figure 2A:
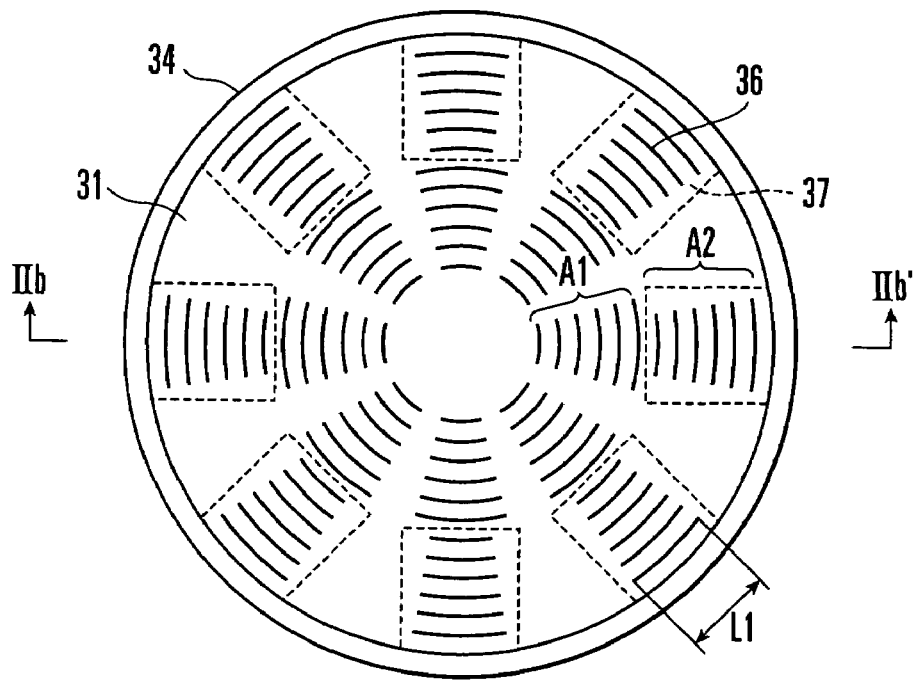
FIG. 2 includes views showing the arrangement of an example of the radial antenna and the distribution of its electric field radiation.
Figure 2B:
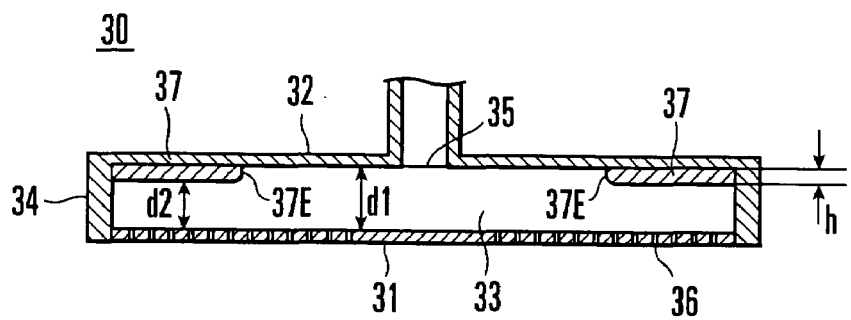
Figure 2C:
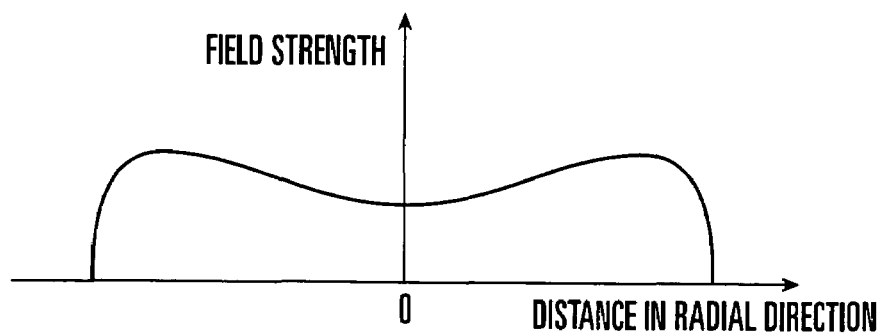
Figure 3A:
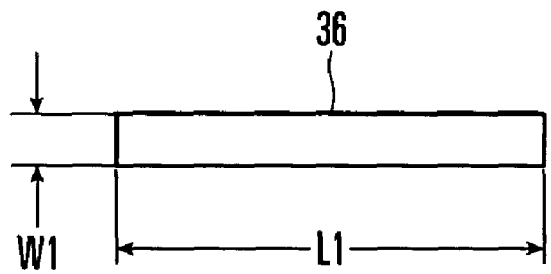
FIG. 3 includes views showing the shapes of slots formed in the radial antenna shown in FIG. 2.
Figure 3B:
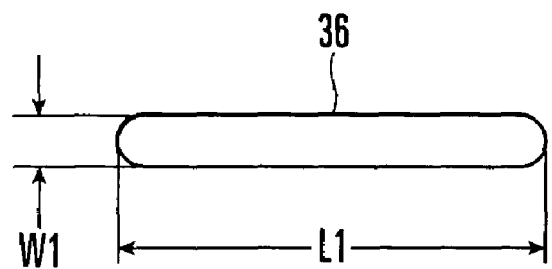
Figure 3C:
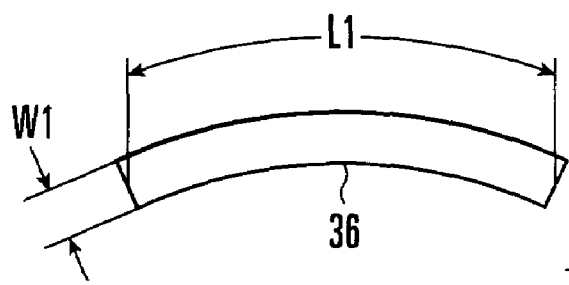
Figure 3D:
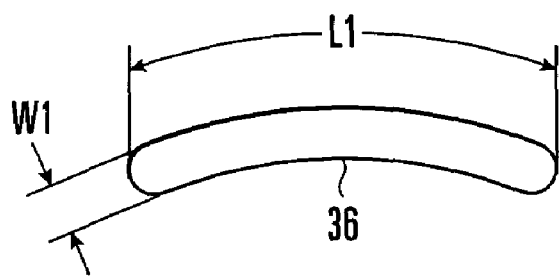

FIG. 2 includes views showing the arrangement of the radial antenna 30 and the distribution of its electric field radiation, in which FIG. 2(a) is a plan view showing the radiation surface of the radial antenna 30, FIG. 2(b) is a sectional view taken along the line IIb-IIb' of FIG. 2(a), and FIG. 2(c) is a conceptual view showing the distribution of the electric field radiated by the radial antenna 30. FIG. 2(a) is shown conceptually to clarify the characteristic feature of the present invention. In FIG. 2(c), the axis of abscissa represents the distance from the center of the radial antenna 30 in the radial direction, and the axis of ordinate represents the strength of the electric field radiated from the radial antenna 30.

As shown in FIG. 2(b), the radial antenna 30 is formed of the first conductive plate 31 constituting the radiation surface, a second conductive plate 32 arranged above the conductive plate 31 to oppose it, and a ring member 34 for connecting the peripheral edges of the conductive plates 31 and 32. The ring member 34 holds the gap between the conductive plates 31 and 32 to d1. The radial antenna 30 with this arrangement has a hollow cylindrical shape. The two conductive plates 31 and 32 form a radial waveguide 33 which guides the microwave MW. The conductive plates 31 and 32, and ring member 34 are made of a conductor such as copper or aluminum.

A microwave inlet 35 through which the microwave MW is introduced is formed at the center of the conductive plate 32. A large number of slots 36 extending in the circumferential direction are concentrically formed in the conductive plate 31 which forms the radiation surface, as shown in FIG. 2(a).

FIG. 3 includes views showing examples of the shapes of the slots 36. The shapes of the slots 36 may be rectangular as shown in FIG. 3(a), or arcuate as shown in FIG. 3(c). The four corners of each of the slots 36 shown in FIGS. 3(a) and 3(c) may be rounded as shown in FIG. 3(b) and 3(d). In each of the slots 36 shown in FIGS. 3(a) to 3(d), the size in the longitudinal direction, i.e., the slot length, is defined as L1 and the size in the widthwise direction, i.e., the width, is defined as W1.

As shown in FIG. 2(a), the slot lengths L1 of the slots 36 increase in principle as the slots 36 are further away from the center from the conductive plate 31. Note that in the radial direction, the slot lengths L1 are discontinuous across the boundary between a region A1 that does not oppose ridges 37 (to be described later) and a region A2 that opposes them. Assuming that the wavelength of the microwave MW in the radial waveguide 33 is $\lambda g$, the slot length L1 is set sufficiently smaller than a length corresponding to $\lambda g/2$ at maximum. In this radial antenna 30, the maximum slot length L1 is set to $\lambda g/3$.

The width W1 of each slot 36 is set to about 2 mm considering the influence on the electromagnetic field in the radial waveguide 33 and the like.

Figure 4A:
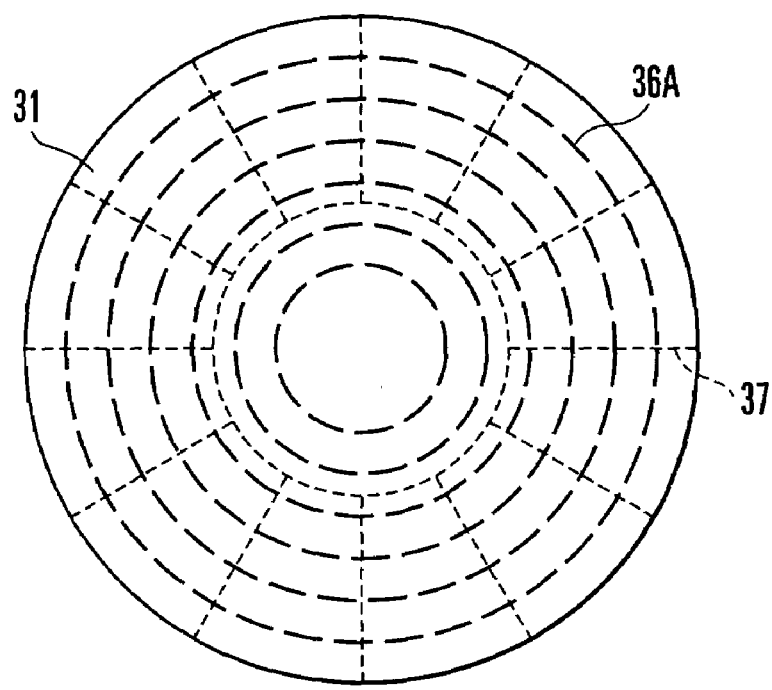
FIG. 4 includes plan views showing the arrangements of examples of a conductive plate that forms a radiation surface.
Figure 4B:
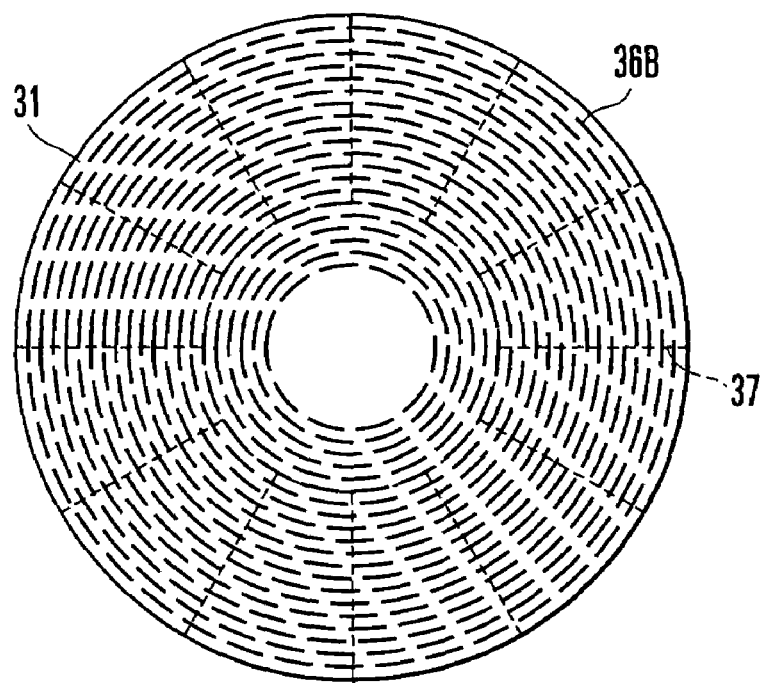

The pitch among the slots 36 in the radial direction is set on the basis of $\lambda g$. To realize a radiation type antenna as shown in FIG. 4(a), the pitch is set to about a length corresponding to $\lambda g$. To realize a leak antenna as shown in FIG. 4(b), the pitch is set to about a length corresponding to $\lambda g/20$ to $\lambda g/30$.

As shown in FIG. 1, a coaxial cable 41 is connected to the center of the radial antenna 30. An outer conductor 41A of the coaxial cable 41 is connected to the microwave inlet 35 of the conductive plate 32. The distal end of a central conductor 41B of the coaxial cable 41 forms a circular cone, and the bottom of the circular cone is connected to the center of the conductive plate 31.

The coaxial cable 41 connected to the radial antenna 30 in this manner is connected to a microwave generator 45 through a rectangular coaxial converter 42 and rectangular waveguide 43. The microwave generator 45 generates the microwave MW of, e.g., 2.45 GHz. The frequency of the microwave MW suffices if it falls within the range of 1 GHz to 10-odd GHz. A matching circuit 44 for impedance matching is connected midway along the rectangular waveguide 43, so that the power use efficiency can be improved.

As shown in FIG. 2(b), in the radial waveguide 33, a plurality of ridges 36 are fixed to the lower surface of the conductive plate 32. These ridges 37 are made of a conductor such as copper or aluminum, and are fixed with machine screws from the conductive plate 36 side. The ridges 37 are quadrangular prismatic members with a height h smaller than d1, and operate as adjusting members for adjusting the distance up to the upper surface of the conductive plate 31. Of the edges of each ridge 37, an edge 37E which is the closest to the center of the radial waveguide 33 is chamfered as shown in FIG. 2(b).

As shown in FIG. 2(a), the ridges 37 are disposed radially in that region A2 which is away from the center of the conductive plate 32 by a predetermined distance or more and where the radiated electric field strength is to be increased. At this time, the ridges 37 are disposed on a region opposing the slots 36. As shown in FIGS. 4(a) and 4(b), when slots 36A and 36B are formed in the entire region of the conductive plate 31 excluding the central portion, the ridges 37 are arranged continuously in the circumferential direction.

At the region A1 where no ridges 37 are disposed, the height of the radial waveguide 33 corresponds to the distance d1 from the conductive plate 32 to the conductive plate 31. In contrast to this, at the region A2 where the ridges 37 are disposed, the height of the radial waveguide 33 corresponds to a distance d2 (=d1−h (<d1)) from the ridges 37 to the conductive plate 31. At the region A2 where the height of the radial waveguide 33 is small due to the presence of the ridges 37, the power density increases. Therefore, at the region A2 provided with the ridges 37, the radiated electric field strength can be increased even when the slot length L1 is decreased to be sufficiently smaller than a length corresponding to $\lambda g/2$.

Resonance can be suppressed if the slot length L1 is decreased to be sufficiently smaller than a length corresponding to $\lambda g/2$. Thus, even if the width W1 of each slot 36 is as small as 2 mm, induction of abnormal discharge can be prevented. More preferably, when $L1<\lambda g/3$, induction of abnormal discharge can be prevented effectively.

Furthermore, when the slot length L1 of each slot 36 is adjusted in accordance with the distance from the center of the conductive plate 32 so that the radiated electric field strength is controlled, an electric field radiation distribution as shown in, e.g., FIG. 2(c), can be obtained without inducing abnormal discharge.

A delay member made of a dielectric material such as a ceramic material with a relative dielectric constant larger than 1 may be arranged in the radial waveguide 33. When the delay member is used, the electric field radiation efficiency can be improved.

The operation of the etching apparatus shown in FIG. 1 will be described.

The substrate 21 is placed on the upper surface of the susceptor 22, and the interior of the processing vessel 11 is set to a vacuum degree of, e.g., about 0.01 Pa to 10 Pa. While maintaining this vacuum degree, Ar is supplied as the plasma gas from the plasma gas supply nozzle 15, and an etching gas such as $CF_4$ is supplied from the process gas supply nozzle 16 under flow rate control.

With the plasma gas and etching gas being supplied into the processing vessel 11, the microwave MW from the microwave generator 45 is supplied to the radial antenna 30 through the rectangular waveguide 43, rectangular coaxial converter 42, and coaxial cable 41.

The microwave MW supplied to the radial antenna 30 propagates radially from the center toward the periphery of the radial waveguide 33 formed of the conductive plates 31 and 32. At this time, the microwave MW is radiated gradually from the slots 36, so the power of the microwave MW propagating in the radial waveguide 33 decreases gradually toward the periphery of the radial waveguide 33. At the region A2 which is away from the center of the conductive plate 32 by the predetermined distance or more and on which the ridges 37 are disposed, however, the height of the radial waveguide 33 changes from d1 to d2 with a decrease corresponding to the height h of the ridges 37, so the power density in the radial waveguide 33 does not become so small as in the conventional case. Hence, even when the slot length L1 is shorter than a length corresponding to $\lambda g/3$, the electric field strength of the microwave MW radiated from all the slots 36 becomes sufficiently large.

On the other hand, since $L1<\lambda g/3$, even if the width W1 of each slot 36 is as small as 2 mm, abnormal discharge is not induced. Therefore, the portion around the slot 36 is not distorted or dissolved by discharge unlike in the conventional case.

The microwave MW radiated from the radial antenna 30 is transmitted through the dielectric plate 13 and is introduced into the processing vessel 11. The microwave MW forms an electric field in the processing vessel 11 to ionize Ar, thus producing a plasma in a space S1 above the substrate 11 as the processing target.

In this etching apparatus, since the susceptor 22 is biased with a negative potential, ions are extracted from the produced plasma to etch a substrate 21.

The radial antenna 30 shown in FIG. 2 uses the ridges 37 with the constant height h. Alternatively, as in a radial antenna 30A shown in FIG. 5, ridges 37A with a height that changes continuously in the radial direction may be disposed on the lower surface of the conductive plate 32, so that the lower surface opposing the conductive plate 31 inclines. At this time, the inclination of the ridges 37A is designed by considering the impedance matching inside and outside the radial antenna 30A.

Second Embodiment

Figure 6A:
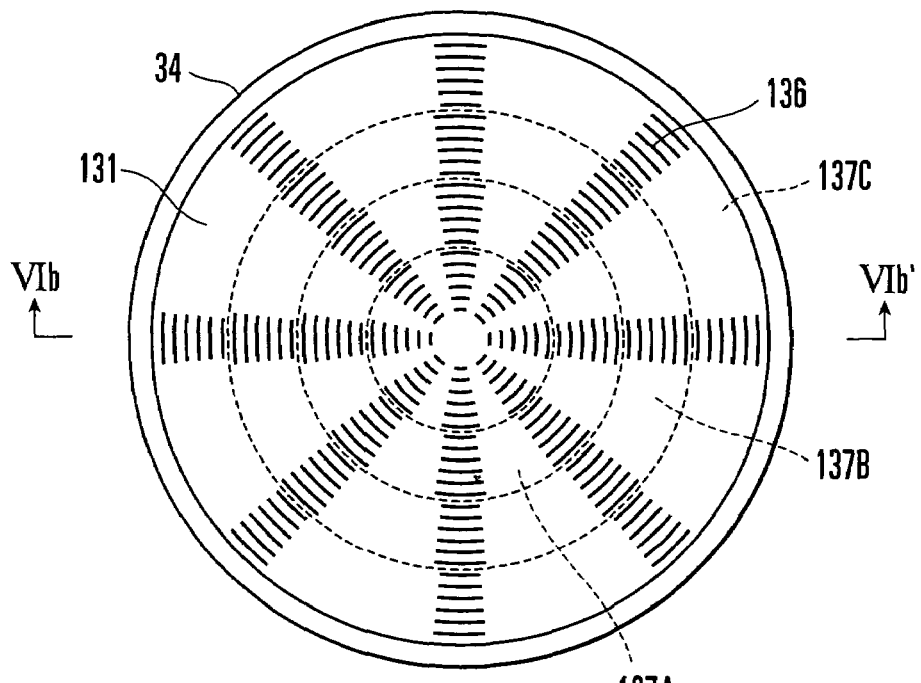
FIG. 6 includes views showing the arrangement of another example of the radial antenna and the distribution of its electric field radiation.
Figure 6B:
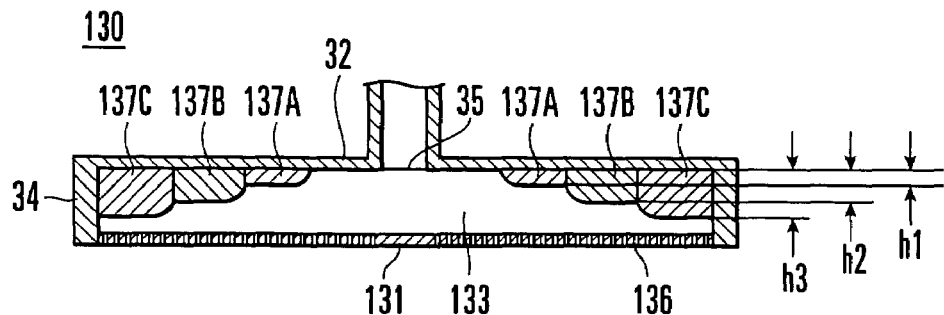
Figure 7A:
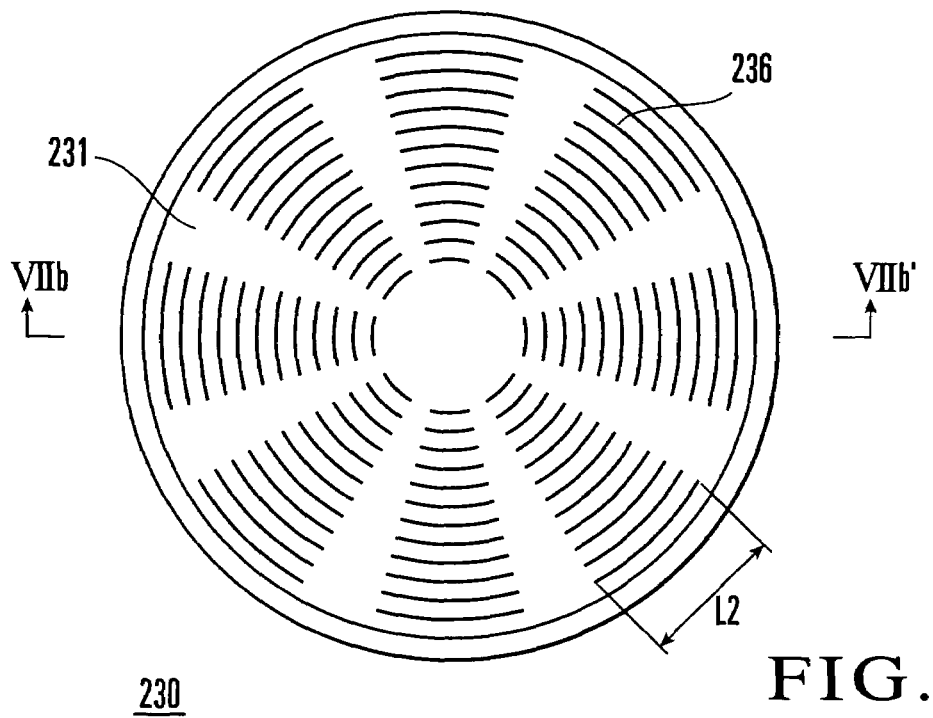
FIG. 7 includes views showing the arrangement of an example of a radial antenna conventionally used in a microwave plasma device, and the distribution of its electric field radiation.
Figure 7B:
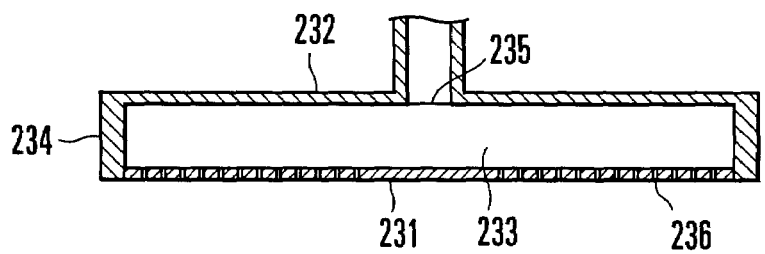
Figure 7C:
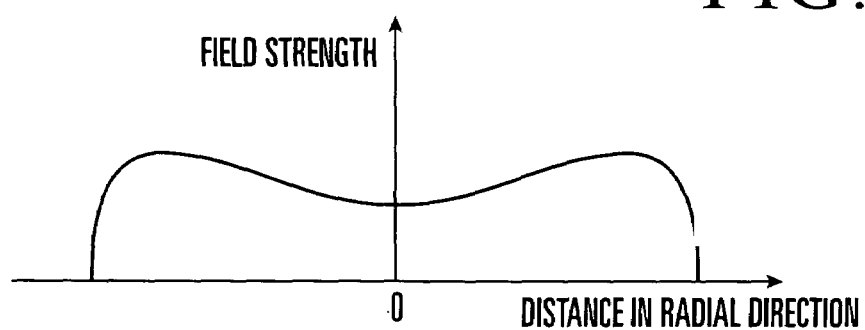
Figure 8:
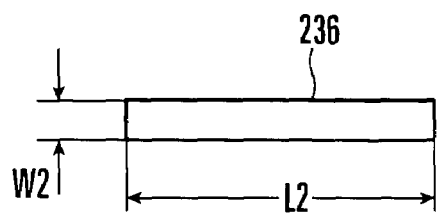
FIG. 8 is a view showing the shape of a slot formed in the radial antenna shown in FIG. 7.

In the radial antenna 30 shown in FIG. 2, the ridges 37 are disposed radially. Alternatively, the ridges may be disposed along the periphery of the conductive plate 32. FIG. 6 includes views showing the arrangement of a radial antenna in which ridges are disposed in this manner. FIG. 6(a) is a plan view showing the radiation surface of the radial antenna, and FIG. 6(b) is a sectional view taken along the line VIb-VIb' of FIG. 6(a). FIG. 6(a) is shown conceptually to clarify the characteristic feature of the present invention. In FIG. 6, the same portions as in FIG. 2 are denoted by the same reference numerals, and a description thereof will be omitted as required.

As shown in FIG. 6, three ridges 137A, 137B, and 137C serving as adjusting members are fixed along the periphery of the lower surface of a conductive plate 32 in a radial waveguide 133. The ridges 137A to 137C form concentric circles conforming to the periphery of the conductive plate 32, and are disposed in this order from the inner side. Assuming that the heights of the ridges 137A, 137B, and 137C are h1, h2, and h3, respectively, h1<h2<h3 holds. Namely, the ridges 137A to 137C become higher as they are further away from the center of the conductive plate 32. Hence, the radial waveguide 133 becomes lower as it is further away from the center of the radial waveguide 133. This can change the power density in the radial waveguide 133 in the radial direction.

Therefore, in the same manner as in the radial antenna 30 shown in FIG. 2, even when a slot length L1 is set to a length sufficiently smaller than a length corresponding to λg/2, e.g., to be sufficiently smaller than a length corresponding to λg/3, if the ridges 137A to 137C are provided, the radiated electric field strength can be increased. Even when a width W1 of each slot 36 is as small as 2 mm, induction of abnormal discharge can be prevented.

Having described a case in which the three ridges 137A to 137C are disposed concentrically, the number of ridges is not limited to three.

Figure 5:
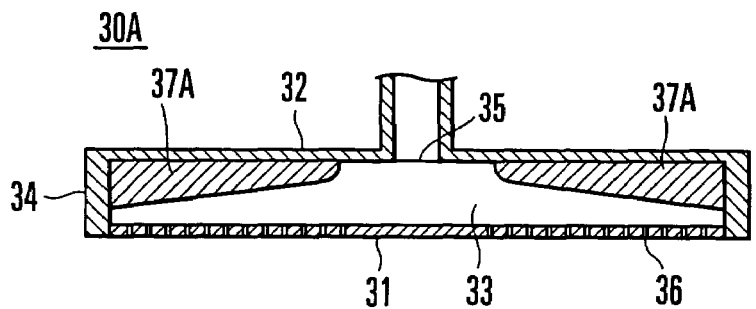
FIG. 5 is a sectional view showing a modification of ridges.

While the heights h1, h2, h3 of the respective ridges 137A, 137B, and 137C are each constant, they may change continuously in the radial direction in the same manner as in the ridges 37 shown in FIG. 5.

As has been described above, in the above embodiments, adjusting members for adjusting the distance from the second conductive plate to the first conductive plate, which two conductive plates forming the radial waveguide, are provided. At the periphery of the radial waveguide where the power density conventionally decreases, the power density can be increased by decreasing the height of the radial waveguide. Even when the slot length is decreased to be sufficiently smaller than a length corresponding to λg/2, the radiated electric field strength can be increased. Hence, when adjusting members are provided to correspond to a region where the radiated electric field strength is to be increased, a desired electric field distribution can be obtained without inducing abnormal discharge.

The plasma device using the radial antenna according to the present invention can be applied not only to the etching apparatus described above but also to other plasma devices such as a plasma CVD apparatus or ashing apparatus. The application of the radial antenna according to the present invention is not limited to the plasma device described above. For example, the radial antenna according to the present invention may be applied to a communication antenna, particularly, a distributor/synthesizer which distributes and synthesizes a transmission/reception signal of an array antenna.

The invention claimed is:

1. A radial antenna comprising:
   a first conductive plate in which a plurality of slots are formed,
   a second conductive plate in which a microwave inlet is formed at a central portion thereof, the second conductive plate disposed opposite to said first conductive plate,
   a ring member for connecting peripheral edges of said first and second conductive plates, and
   a conductive adjusting member attached to the second conductive plate in a region excluding the central portion of said second conductive plate in which the microwave inlet is formed, the conductive adjusting member disposed in a radial waveguide formed by said first and second conductive plates such that a distance between the conductive adjusting member and said first conductive plate is smaller than a distance between the second conductive plate and the first conductive plate;
   wherein the conductive adjusting member comprises an electrically conductive adjusting member.

2. A radial antenna according to claim 1, characterized in that said conductive adjusting member is disposed at an outer peripheral portion of said second conductive plate.

3. A radial antenna according to claim 1, characterized in that said adjusting member is disposed along the peripheral edge of said second conductive plate.

4. A radial antenna according to claim 1, characterized in that said adjusting member is set to become higher as being further away from a center of said second conductive plate.

5. A radial antenna according to claim 1, characterized in that the slots are substantially rectangular or arcuate, and
   a slot length of the slots is smaller than a length corresponding to ⅓ the wavelength of a microwave propagating in said radial waveguide.

6. A plasma device characterized by comprising
   a susceptor for placing a target object thereon,
   a processing vessel for accommodating said susceptor,
   exhaust means for evacuating an interior of said processing vessel,
   gas supply means for supplying a gas into said processing vessel, and
   antenna means which is arranged to oppose that surface of said susceptor where the target object is to be placed and which supplies a microwave into said processing vessel,
   wherein said antenna means comprises a radial antenna according to claim 1.

7. A radial antenna according to claim 1, wherein the conductive adjusting member is configured to increase a power density at a peripheral portion of the radial waveguide.

8. A radial antenna according to claim 1, characterized in that a plurality of said conductive adjusting members are disposed radially when viewed from top.

* * * * *